(12) United States Patent
Motomura et al.

(10) Patent No.: US 11,330,718 B2
(45) Date of Patent: May 10, 2022

(54) PRINTED WIRING BOARD PRODUCTION METHOD AND PRINTED WIRING BOARD PRODUCTION APPARATUS

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Junichi Motomura, Osaka (JP); Koji Nitta, Osaka (JP); Shoichiro Sakai, Osaka (JP); Kenji Takahashi, Osaka (JP); Maki Ikebe, Osaka (JP); Kousuke Miura, Shiga (JP); Masahiro Itoh, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 134 days.

(21) Appl. No.: 16/621,447

(22) PCT Filed: May 21, 2018

(86) PCT No.: PCT/JP2018/019493
§ 371 (c)(1),
(2) Date: Dec. 11, 2019

(87) PCT Pub. No.: WO2019/021599
PCT Pub. Date: Jan. 31, 2019

(65) Prior Publication Data
US 2020/0236791 A1  Jul. 23, 2020

(30) Foreign Application Priority Data

Jul. 26, 2017  (JP) .............................. JP2017-144089
Nov. 13, 2017  (JP) .............................. JP2017-218616

(51) Int. Cl.
*H05K 3/18* (2006.01)
*C25D 5/02* (2006.01)
(Continued)

(52) U.S. Cl.
CPC .............. *H05K 3/18* (2013.01); *C25D 5/022* (2013.01); *C25D 7/00* (2013.01); *C25D 17/008* (2013.01);
(Continued)

(58) Field of Classification Search
None
See application file for complete search history.

(56) References Cited

U.S. PATENT DOCUMENTS

2002/0179450 A1* 12/2002 Barrese .................. C25D 17/12
205/96
2009/0127122 A1* 5/2009 Yasmeen ............. H01L 21/2885
205/157
2016/0145760 A1* 5/2016 Fujikata ............... C25D 17/008
205/128

FOREIGN PATENT DOCUMENTS

CN  1372018  10/2002
CN  1372019  10/2002
(Continued)

*Primary Examiner* — Louis J Rufo
(74) *Attorney, Agent, or Firm* — IPUSA, PLLC

(57) ABSTRACT

A printed wiring board production method that forms a base film and a conductive pattern on the base film by an additive method or a subtractive method, includes a plating process that electroplates the conductive pattern on a surface of the base film, wherein the plating process includes a shield plate arranging process that arranges a shield plate between an anode and a printed wiring board substrate that forms a cathode, and a substrate arranging process that arranges the printed wiring board substrate in a plating tank, and wherein (Continued)

a distance between the shield plate and the printed wiring board substrate is 50 mm or greater and 150 mm or less.

8 Claims, 11 Drawing Sheets

(51) Int. Cl.
    *C25D 7/00*     (2006.01)
    *H05K 3/10*     (2006.01)
    *C25D 17/00*     (2006.01)

(52) U.S. Cl.
    CPC ..... *H05K 3/108* (2013.01); *H05K 2203/0723* (2013.01)

(56) References Cited

FOREIGN PATENT DOCUMENTS

| | | |
|---|---|---|
| CN | 101323967 | 12/2008 |
| CN | 201785520 U | 4/2011 |
| CN | 102560609 | 7/2012 |
| CN | 205669074 U | 11/2016 |
| JP | 2000-087295 | 3/2000 |
| JP | 2003-242884 | 8/2003 |
| JP | 2005-042170 | 2/2005 |
| JP | 2008-088522 | 4/2008 |
| JP | 2010-095762 | 4/2010 |
| JP | 2016-195188 | 11/2016 |
| JP | 2016-211010 | 12/2016 |

* cited by examiner

PRINTED WIRING BOARD PRODUCTION METHOD AND PRINTED WIRING BOARD PRODUCTION APPARATUS

TECHNICAL FIELD

The present invention relates to a printed wiring board production method and a printed wiring board production apparatus.

This application is based upon and claims priority to Japanese Patent Application No. 2017-144089, filed on Jul. 26, 2017, and Japanese Patent Application No. 2017-218616, filed on Nov. 13, 2017, the entire contents of which are incorporated herein by reference.

BACKGROUND ART

For the purposes of depositing a uniform plated layer, a means for arranging a shield plate on both left and right sides of a printed wiring board substrate (Patent Document 1), and a method that uses a mesh-like net having an insulation sheet arranged at positions where the plated layer is thickly deposited, are known. The shield plate or the insulation sheet (net) is fixed to the printed wiring board substrate using a jig, or is provided on a jig that holds the printed wiring board substrate within a plating solution storage tank, and a distance to the substrate is less than 50 mm in many cases. Such shields are popularly utilized, because the size, shape, arranging position, or the like of the shield plate or the insulation sheet (hereinafter referred to as the shield plate or the like) can be intuitively and easily changed, corrected, or the like according to the shape and size of the printed wiring board substrate, and the shape or the like of conductive patterns that are formed, and also because a target to be plated and the shield plate or the like are adjacent to each other, and a high shielding effect is obtainable.

In addition, a method that simultaneously plates both surfaces of a plurality of substrates to be plated, has been proposed (Patent Document 3). This method performs a test electroplating or a simulation thereof, to optimize an opening shape of the shield plate, a distance between a target to be plated and the shield plate, and a positional relationship of the target to be plated and the shield plate, and it is regarded that the plated layer thickness can be made uniform.

PRIOR ART DOCUMENTS

Patent Documents

Patent Document 1: Japanese Laid-Open Patent Publication No. 2005-42170
Patent Document 2: Japanese Laid-Open Patent Publication No. 2008-88522
Patent Document 3: Japanese Laid-Open Patent Publication No. 2010-95762

DISCLOSURE OF THE INVENTION

A printed wiring board production method according to one embodiment of the present invention forms a base film and a conductive pattern on the base film by an additive method or a subtractive method, and includes a plating process that electroplates the conductive pattern on a surface of the base film, wherein the plating process includes a shield plate arranging process that arranges a shield plate between an anode and a printed wiring board substrate that forms a cathode, and a substrate arranging process that arranges the printed wiring board substrate in a plating tank by a jig that holds the printed wiring board substrate, and wherein a distance between the shield plate and the printed wiring board substrate is 50 mm or greater and 150 mm or less.

MODE OF CARRYING OUT THE INVENTION

Figure 1:
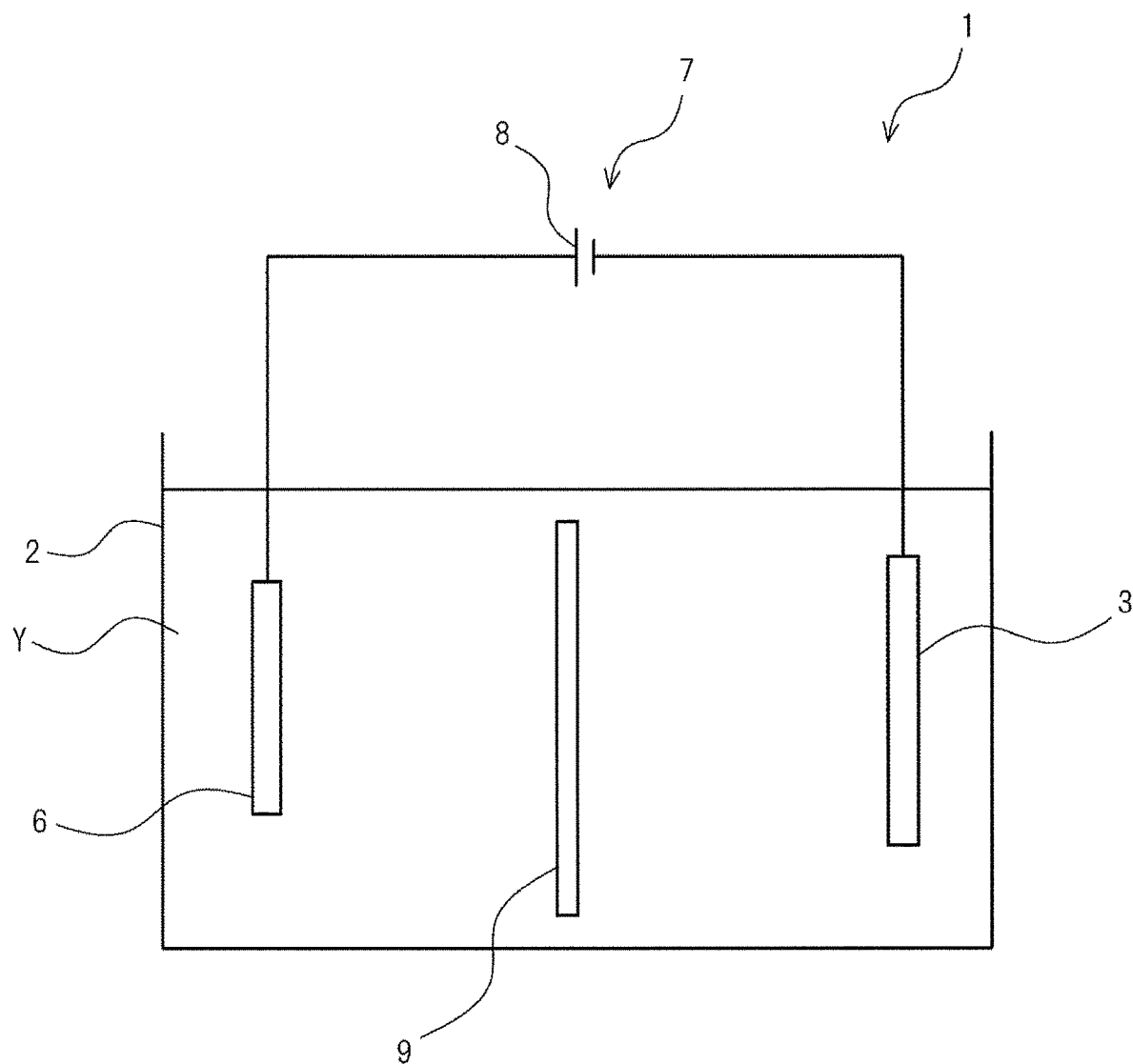
FIG. 1 is a schematic side view illustrating a plating apparatus that is used in a plating process of the printed wiring board production method according to one embodiment of the present invention.

In the field of electronic devices, a printed wiring board is used in many cases. The printed wiring board includes a conductive pattern deposited on at least one surface of an insulating base film. A printed wiring board substrate includes the base film, and a seed layer (thin conductive layer having a thickness of approximately several nm)

deposited on one surface of the base film, for example, and the conductive pattern is obtained by depositing a plated layer on an outer surface of the seed layer of the printed wiring board substrate, and furthermore patterning the seed layer and the plated layer.

Generally, a plating process of a printed wiring board production method, that deposits a plated layer, is performed by a plating apparatus including a plating solution storage tank that stores a plating solution, an anode that is immersed in the plating solution and arranged to oppose a printed wiring board substrate, and a mechanism that applies a voltage to the anode and the printed wiring board substrate. The plating apparatus deposits the plated layer by plating an outer surface of a seed layer that is formed as a cathode.

In order to stably exhibit the performance of the printed wiring board, it is important that conductive patterns within the printed wiring board are uniformly formed, that is, the plated layer is deposited to a uniform thickness. On the other hand, due to improved performance and reduced size of the printed wiring board, both the increase of the density of the conductive patterns and the improvement of the refinement of the conductive patterns have been considerable, and it is not easy to uniformly deposit the plated layer, even by a semi-additive method that is the mainstream nowadays and is regarded as being an advantageous method of forming micro-patterns.

[Problem To Be Solved By Present Disclosure]

The shield adjacent to the substrate, as in the Patent Documents 1, 2, and 3, requires an extremely strict positional relationship of the shield plate or the like and the position of the target to be plated requiring the shielding, and a workability is not good in that even a slight misalignment of the shield plate or the like, or the printed wiring board substrate, fixed to a jig, may cause rapid deterioration of the thickness uniformity of the plated layer.

In addition, according to the method of the Patent Document 3, the test electroplating or simulation thereof is troublesome to perform, and is not preferable from a viewpoint of production efficiency. Further, because the target to be plated is arranged between the shield plates, the substrate to be plated and the shield plates may collide when the substrate to be plated is set into the plating solution storage tank and when the substrate after the plating is extracted from the plating solution storage tank.

Accordingly, it is one object of the present disclosure to provide a printed wiring board production method and a printed wiring board production apparatus, which have a good workability and can easily arrange and replace the printed wiring board substrate, and make the plated layer thickness uniform.

[Effects of Present Disclosure]

The printed wiring board production method and the printed wiring board production apparatus according to the present disclosure have a good workability and can easily arrange and replace the printed wiring board substrate, and make the plated layer thickness uniform.

[Description of Embodiments of Present Invention]

First, embodiments of the present invention will be presented and described.

The printed wiring board production method according to one embodiment of the present invention, is a printed wiring board production method that forms a base film, and a conductive pattern on the base film, by an additive method or a subtractive method, and includes a plating process that electroplates the conductive pattern on a surface of the base film, wherein the plating process includes a shield plate arranging process that arranges a shield plate between an anode and a printed wiring board substrate forming a cathode, and a substrate arranging process that arranges the printed wiring board substrate in a plating solution storage tank by a jig for holding the printed wiring board substrate, and wherein a distance between the shield plate and the printed wiring board substrate is 50 mm or greater and 150 mm or less.

The plating process of the printed wiring board production method arranges the printed wiring board substrate, having the base film and a seed layer deposited on at least one of the surfaces of the base film, so that an outer surface of the seed layer opposes the anode, and supplies a current to the anode from a voltage applying mechanism which applies a voltage, to reduce metal ions dissolved within the plating solution on the outer surface of the seed layer forming the cathode, and deposit the plated layer on the outer surface of the seed layer. In this printed wiring board production method, by arranging the shield plate between the anode and the printed wiring board substrate, at the distance of 50 mm or greater and 150 mm or less from the printed wiring board substrate, an appropriate current distribution is obtained within the plating solution, and the metal ions can be uniformly reduced on the outer surface of the seed layer forming the cathode, to make the plated layer thickness uniform. In addition, by setting the distance between the shield plate and the printed wiring board substrate to fall within the above-mentioned range, the arrangement and replacement operation of the printed wiring board substrate in the plating solution storage tank are simplified, and the production efficiency of the printed wiring board is improved.

The above-mentioned jig preferably includes a shield member. When the plating process is performed in a state where the printed wiring board substrate is misaligned in a horizontal direction within the plating solution storage tank, that is, misaligned along a width direction of the printed wiring board substrate, the plated layer thickness may vary near an end part along the width direction of the printed wiring board substrate. In this printed wiring board production method, the jig that holds the printed wiring board substrate within the plating solution storage tank includes the shield member, and thus, the current distribution near the end part along the width direction of the printed wiring board substrate can be set appropriately. Hence, even when the plating process is performed in the state where the printed wiring board substrate is misaligned in the horizontal direction within the plating solution storage tank, it is possible to make the plated layer thickness uniform in the printed wiring board substrate.

The above-mentioned shield member is preferably arranged at an end region along at least the width direction of the printed wiring board substrate in a plan view. When the shield member covers the end region along at least the width direction of the printed wiring board substrate in the plan view, it is possible to appropriately set the current distribution near the end part along the width direction of the printed wiring board substrate.

The shield member preferably includes shield member openings. When the shield member includes the shield member openings, it is possible to more appropriately set the current distribution near the end part along the width direction of the printed wiring board substrate within the plating solution, and the plated layer thickness can be made even more uniform near the end part of the printed wiring board substrate.

An opening ratio of the above-mentioned shield member is preferably 20% or higher and 80% or lower. When the opening ratio of the shield member is 20% or higher and 80% or lower, it is possible to more appropriately set the current distribution near the end part along the width direction of the printed wiring board substrate, and the plated layer thickness can be made even more uniform near the end part of the printed wiring board substrate.

The above-mentioned shield plate preferably includes shield plate openings. When the shield plate includes the shield plate openings, the current distribution is more appropriately set within the plating solution, and the plated layer thickness can be made even more uniform.

Preferably, the shield plate openings are formed at an opening region of the shield plate, the opening region is a region opposing the printed wiring board substrate in the plan view, and an opening ratio of a central opening region of the above-mentioned opening region is 10% or higher and 50% or lower, and an opening ratio of an end opening region of the above-mentioned opening region is higher than the opening ratio of the central opening region. When the shield plate openings are not formed at a part larger than an external size of the printed wiring board substrate, and are formed in the region opposing the printed wiring board substrate, it is possible to effectively reduce concentration of the current distribution near an outer peripheral end part of the printed wiring board substrate. In addition, when the opening ratio of the central opening region is 10% or higher and 50% or lower, and the opening ratio at the end of the opening region is set higher than the opening ratio of the central opening region, the plated layer thickness of the printed wiring board substrate can be made even more uniform.

The external size of the above-mentioned shield plate is preferably greater than the external size of the printed wiring board substrate in the plan view. Generally, the plated layer thickness near the outer peripheral end part of the printed wiring board substrate tends to become thick. But when the external size of the shield plate is greater than the external size of the printed wiring board substrate in the plan view, it is possible to prevent the current distribution from concentrating near the outer peripheral end part of the printed wiring board substrate, and reduce the increase of the plated layer thickness near the outer peripheral end part.

An anode shield plate is preferably arranged between the above-mentioned shield plate and the anode. By further arranging the anode shield plate, the current distribution can be made uniform near the anode, and combined with the effects of the shield plate, it is possible to make the plated layer thickness even more uniform.

The anode shield plate preferably includes anode shield plate openings. Because the anode shield plate includes the anode shield plate openings, an exposure area (effective area) of the anode with respect to the printed wiring board substrate can be appropriately adjusted, to make the current distribution even more uniform near the anode, and combined with the effects of the shield plate, it is possible to make the plated layer thickness even more uniform.

An area of the anode shield plate (an area of the anode shield plate including the anode shield plate openings in a case where the anode shield plate includes the anode shield plate openings) in the above-mentioned plating process is preferably greater than an immersion area of the anode into the plating solution. By making the immersion area of the anode shield plate into the plating solution greater than the immersion area of the anode into the plating solution, it is possible to further reduce the increase of the plated layer thickness near the outer peripheral end part of the printed wiring board substrate.

Preferably, the thickness of the plated layer formed as the above-mentioned conductive pattern is 30 μm or greater, and an inconsistency of the thickness is within 15% of an average thickness of the plated layer. Generally, the greater the plated layer thickness becomes, there is a tendency for the inconsistency of the plated layer thickness to increase. When the plated layer thickness of the conductive pattern of the printed wiring board is 30 μm or greater, and the inconsistency of the thickness is within 15% of the average thickness of the plated layer, it is possible to stabilize the performance of a product device using the printed wiring board.

The above-mentioned conductive pattern is preferably deposited by the semi-additive method. It is not easy to uniformly deposit the plated layer, even by the semi-additive method that is the mainstream nowadays and is regarded as being the advantageous method of forming micro-patterns. But according to the printed wiring board production method of the embodiment, a complicated shield structure, accurate and rigid fixing of the shield plate, or the like are not required, and a satisfactory effect of making the plated layer thickness uniform can be exhibited by a simple arrangement of the shield plate using the semi-additive method.

The printed wiring board production apparatus according to another embodiment of the present invention, is a printed wiring board production apparatus that forms a base film, and a conductive pattern on the base film, by the additive method or the subtractive method, and includes a plating solution storage tank, a substrate fixing mechanism that fixes the printed wiring board substrate that is the target to be plated, an anode arranged to oppose the printed wiring board substrate, a shield plate arranged between the printed wiring board substrate and the anode, and a voltage applying mechanism that applies a voltage to the anode, and the printed wiring board substrate forming a cathode, wherein a distance between the shield plate and the printed wiring board substrate is 50 mm or greater and 150 mm or less.

The printed wiring board production apparatus arranges the printed wiring board substrate, having the base film and a seed layer deposited on at least one of the surfaces of the base film, so that an outer surface of the seed layer opposes the anode. The printed wiring board production apparatus supplies a current to the anode from the voltage applying mechanism which applies the voltage, to reduce metal ions dissolved within the plating solution on the outer surface of the seed layer forming the cathode, and deposit the plated layer on the outer surface of the seed layer. In this printed wiring board production apparatus, by arranging the shield plate between the anode and the printed wiring board substrate, at the distance of 50 mm or greater and 150 mm or less from the printed wiring board substrate, an appropriate current distribution is obtained within the plating solution, and the metal ions can be uniformly reduced on the outer surface of the seed layer forming the cathode, to make the plated layer thickness uniform.

The plating solution storage tank preferably includes a shield plate fixing mechanism that fixes the above-mentioned shield plate. When the plating solution storage tank includes the shield plate fixing mechanism that fixes the shield plate, the shield plate can be arranged and fixed with ease. When the shape or size of the printed wiring board substrate, or the structure of the conductive pattern that is formed changes, it is possible to easily cope with the change by replacing the shield plate by an optimum shield plate that is selected in the shield plate fixing mechanism.

[Details of Embodiments of Present Invention]

Next, the printed wiring board production method and the printed wiring board production apparatus according to the embodiment of the present invention will be described by referring to the drawings, as appropriate.

First Embodiment

<Printed Wiring Board Production Method>

The printed wiring board production method according to one embodiment of the present invention includes a plating process that electroplates a conductive pattern on a surface of a base film. This plating process is performed by a plating apparatus 1 including a plating solution storage tank 2 that stores a plating solution Y, a fixing jig 3 that fixes a printed wiring board substrate X forming a cathode and immersed in the plating solution Y, an anode 6 immersed in the plating solution Y and arranged to oppose the printed wiring board substrate X, and a mechanism 7 (hereinafter also referred to as a "voltage applying mechanism 7") that applies a voltage to the anode 6 and the printed wiring board substrate X, as illustrated in FIG. 1, for example. First, the plating apparatus 1 will be described before describing the plating process. In the following description, "up" refers to a direction of an opening of the plating solution storage tank 2, "down" refers to a direction of a bottom of the plating solution storage tank 2, "front and rear" refers to a direction along a long side of the bottom of the plating solution storage tank 2, and "left and right" refers to a direction along a short side of the bottom of the plating ink tank 2.

[Plating Apparatus]

The plating apparatus 1 is used in a state where the printed wiring board substrate X, including the base film and the seed layer deposited on one of the surfaces of the base film, is arranged so that the outer surface of the seed layer opposes an opposing surface of the anode 6, for example. The plating apparatus 1 supplies the current to the anode 6 from the voltage applying mechanism 7, and can reduce the metal ions dissolved within the plating solution Y on the outer surface of the seed layer forming the cathode, to deposit the plated layer on the outer surface of the seed layer. In this plating apparatus 1, a shield plate 9 is arranged between the anode 6 and the printed wiring board substrate X, and the distance between the printed wiring board substrate X and the shield plate 9 is set to 50 mm or greater and 150 mm or less, so that the appropriate current distribution is obtained within the plating solution Y, and the metal ions are uniformly reduced on the outer surface of the seed layer, to make the plated layer thickness uniform.

(Anode)

The anode 6 has a constant thickness and a plate shape. In addition, the anode 6 is formed to a rectangular shape in a front view from the printed wiring board substrate X. A "front view from A" refers to a state visible when viewed from A. In other words, a "front view from the printed wiring board substrate X, or the anode 6" refers to a visible state when viewed from the printed wiring board substrate X or the anode 6.

The external size of the anode 6 in the state immersed in the plating solution Y is not particularly limited, but a lower limit value of an average length along the up and down direction is preferably 200 mm, and more preferably 500 mm. An upper limit value of the average length along the up and down direction is preferably 1000 mm, and more preferably 800 mm. A lower limit value of the average length along the horizontal direction is preferably 200 mm, and more preferably 450 mm. An upper limit value of the average length along the horizontal direction is preferably 1000 mm, and more preferably 750 mm. When the average lengths along the up and down direction and the horizontal direction do not reach the respective lower limits, it may not be possible to obtain a sufficient production efficiency of the printed wiring board. When the average lengths along the up and down direction and the horizontal direction exceed the respective upper limits, it may become difficult to control the plated layer thickness deposited on the printed wiring board substrate X. Generally, the anode 6 contracts when immersed in the plating solution Y. For this reason, in a state not immersed in the plating solution Y, the average length of the anode 6 along the up and down direction may be approximately 400 mm or greater and approximately 1200 mm or less, for example, and the average length along the horizontal direction may be approximately 300 mm or greater and approximately 1000 mm or less, for example.

The distance between the anode 6 and the printed wiring board substrate X is not particularly limited, but a lower limit is preferably 100 mm, and more preferably 125 mm. In addition, an upper limit of the distance is preferably 300 mm, and more preferably 250 mm. When the distance does not reach the lower limit, it may become difficult to uniformly deposit the plated layer on the printed wiring board substrate X. When the distance exceeds the upper limit, it may become difficult to control the plated layer thickness deposited on the printed wiring board substrate X.

A current density of the anode 6 is not particularly limited, but a lower limit is preferably 1.0 ASD (0.01 A/m$^2$), and more preferably 1.2 ASD (0.012 A/m$^2$). In addition, an upper limit of the current density is preferably 4.5 ASD (0.045 A/m$^2$), and more preferably 3.0 ASD (0.03 A/m$^2$). When the current density of the anode 6 does not reach the lower limit, it may not be possible to obtain a sufficient production efficiency of the plated layer deposited on the printed wiring board substrate X. When the current density of the anode 6 exceeds the upper limit, it may become difficult to control the plated layer thickness deposited on the printed wiring board substrate X.

The anode 6 is not particularly limited, and for example, known anodes including a soluble anode, an insoluble anode, or the like, may be used therefor. The soluble anode may have a metal such as copper, nickel, silver, or the like as a main component thereof, and the insoluble anode may use platinum, iridium-coated titanium, or the like. Among such anodes, the insoluble anode is preferable in that a change in the shape of the anode itself can be prevented, and the plated layer thickness can be uniformly deposited with ease on the printed wiring board substrate X.

(Fixing Jig)

Figure 2:
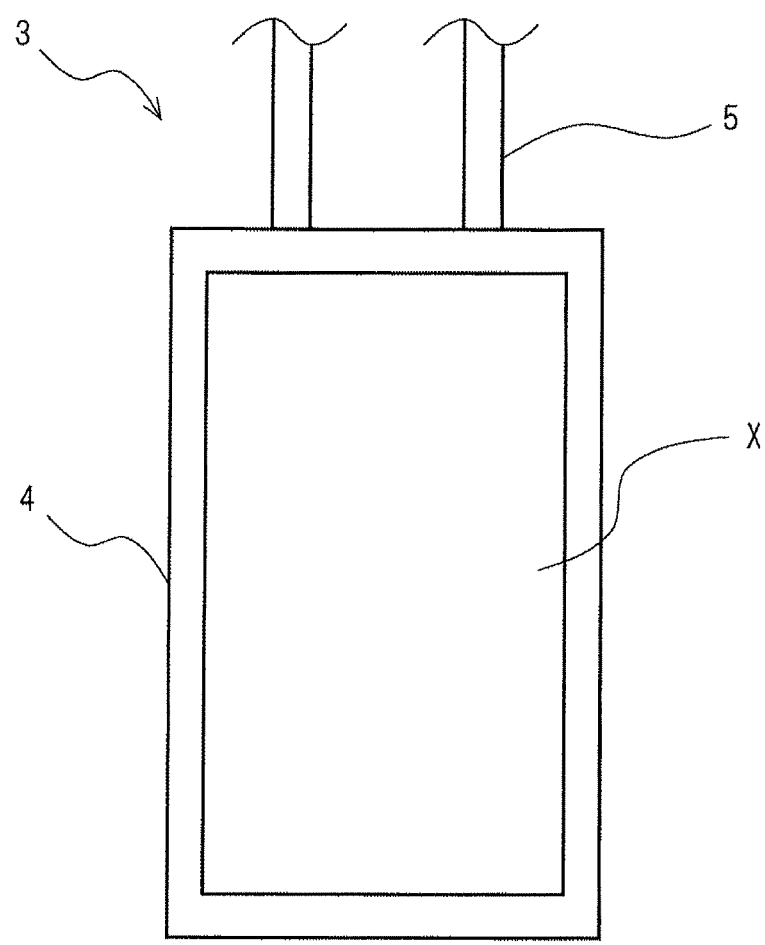
FIG. 2 is a schematic front view illustrating a fixing jig used by the plating apparatus of FIG. 1.

The fixing jig 3 includes a frame 4 that includes an opening and holds an outer periphery of the printed wiring board substrate X, and a pair of arms 5 extending upward from the frame 4, as illustrated in FIG. 2. The pair of arms 5 engages bars (not illustrated) suspended above a liquid surface of the plating solution Y, and suspends the frame 4, and the printed wiring board substrate X held by the frame 4, within the plating solution Y.

The frame 4 includes an inner edge and an outer edge forming a rectangular frame body, and holds the printed wiring board substrate X at the opening thereof. In other words, the frame 4 holds the printed wiring board substrate X so as to cover the outer periphery of the printed wiring board substrate X. As an example, the frame 4 that holds the entire outer periphery of the printed wiring board substrate X will be described, however, the frame 4 is not limited to such, and known frames, including a frame that holds two sides of the printed wiring board substrate X, such as the left and right sides in FIG. 2, for example, a frame that holds one side of the printed wiring board substrate X, such as only the top side in FIG. 2, for example, or the like, may be used therefor. Similarly, the arms 5 are not limited to that formed by the pair, and known arms, such as that formed by a single arm, or the like, may be used therefor.

The substrate X for the printed wiring board, held by the frame 4, includes the insulating base film, and the conductive seed layer deposited on one surface of the base film, and is arranged within the plating solution Y so that the seed layer opposes the anode 6.

(Voltage Applying Mechanism)

The voltage applying mechanism 7 includes a power supply 8 that supplies a current to the anode 6. In addition, the voltage applying mechanism 7 includes a first interconnection part that electrically connects the power supply 8 and the anode 6, and a second interconnection part that electrically connects the power supply 8 and the seed layer of the printed wiring board substrate X held by the fixing jig 3. The electrical connection to the seed layer and the second interconnection part may be provided on the fixing jig 3, or provided independently of the fixing jig 3.

(Plating Solution)

The plating solution Y is not particularly limited, but known plating solutions including copper sulfate, copper pyrophosphate, or the like, for example, may be used therefor.

(Shield Plate)

The shield plate 9 has a constant thickness and a plate shape. The shape of the shield plate 9 is not particularly limited, but the shield plate 9 preferably has a rectangular shape in the plan view when the printed wiring board substrate X, that is the target to be plated, has a rectangular shape in the plan view.

A material used for the shield plate 9 is not particularly limited, as long as the material is an insulator that has plating resistance, and for example, known materials including vinyl chloride, polytetrafluoroethylene, or the like, may be used therefor.

The shield plate 9 is arranged between the anode 6 and the printed wiring board substrate X. More particularly, the shield plate 9 is arranged parallel to the anode 6 and the printed wiring board substrate X, and overlaps the printed wiring board substrate X in a front view from the anode 6. In the plating solution Y, a distribution of the current flowing from the anode 6 to the seed layer of the printed wiring board substrate X forming the cathode, becomes dense near the outer peripheral end part of the printed wiring board substrate X, and the plating layer becomes thick thereat. In addition, even at parts other than the outer peripheral end part of the printed wiring board substrate X, the current distribution becomes sparse at parts where the seed layer that becomes the conductive pattern is exposed (hereinafter also referred to as the exposed seed layer) is densely provided, and the current distribution becomes dense at parts where the exposed seed layer is sparsely provided, to thereby generate inconsistencies in the plated layer thickness. Further, depending on individuality based on the specific configuration or the like of the apparatus, it may be difficult to obtain a uniform current distribution. The shield plate 9 is arranged to make uniform the current distribution that may become sparse or dense. In other words, it is possible to uniformly deposit the plated layer by arranging the shield plate 9. "Parallel" referred above not only includes a perfectly parallel state, but also includes states where an inclination is within 5 degrees. Moreover, "the shield plate 9 that overlaps the printed wiring board substrate X in the front view from the anode 6" referred above includes a state where the printed wiring board substrate X is concealed by the shield plate 9 in the front view from the anode 6 when the external size of the shield plate 9 is larger than the external size of the printed wiring board substrate X, and a state where the shield plate 9 falls within a range of the printed wiring board substrate X in the front view from the anode 6 when the external size of the shield plate 9 is the same as or smaller than the external size of the printed wiring board substrate X.

A lower limit value of the distance between the shield plate 9 and the printed wiring board substrate X is 50 mm, preferably 60 mm, and more preferably 70 mm. An upper limit value of the above-mentioned distance is 150 mm, preferably 140 mm, and more preferably 130 mm. When the above-mentioned distance does not reach the above lower limit, the distance for making the current distribution sufficiently uniform cannot be obtained, and it may not be possible to deposit the plated layer to a uniform thickness in a case where the printed wiring board substrate X is warped, or the printed wiring board substrate X is fixed to the fixing jig 3 at a position deviated from a normal fixing position. When the above-mentioned distance exceeds the above upper limit, the current distribution that is once made uniform may lose the uniformalizing effect of the shield plate 9 before the printed wiring board substrate X is reached, and it may not be possible to deposit the plated layer to a uniform thickness. The "distance between the shield plate 9 and the printed wiring board substrate X" refers to the distance between a center of the surface of the printed wiring board substrate X having the exposed seed layer, and a center of the surface of the shield plate 9 opposing the printed wiring board substrate X.

The external size of the shield plate 9 that is formed to the rectangular shape is not particularly limited, but the external size of the shield plate 9 is preferably larger than the external size of the printed wiring board substrate X. For example, a lower limit value of the length along the up and down direction may be 400 mm, and preferably 550 mm. An upper limit value of the length along the up and down direction may be 1300 mm, and preferably 850 mm. A lower limit value of the length along the horizontal direction may be 400 mm, and preferably 500 mm. An upper limit value of the length along the horizontal direction may be 1100 mm or less, and preferably 800 mm. By making the external size of the shield plate 9 larger than the external size of the printed wiring board substrate X, it is possible to prevent the current distribution from concentrating near the outer peripheral end part of the printed wiring board substrate X.

Figure 3:
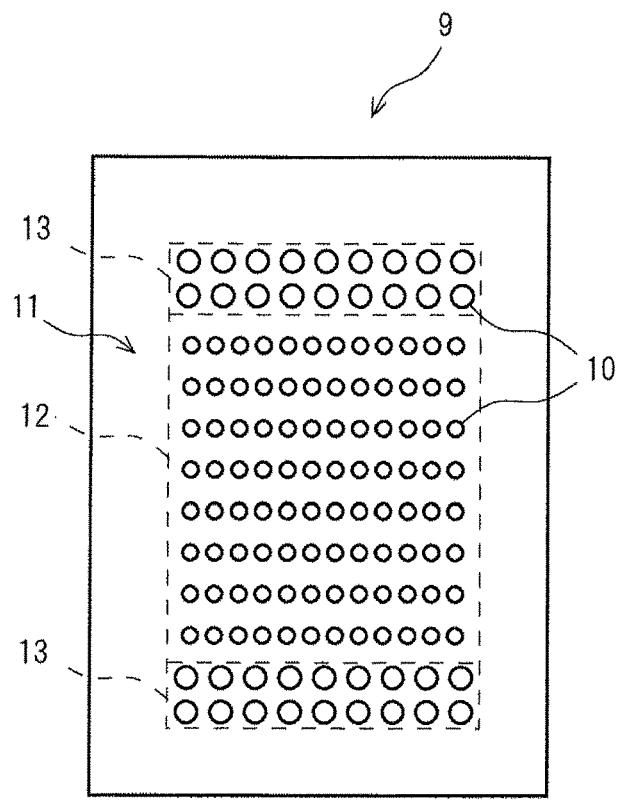
FIG. 3 is a schematic front view illustrating a shield plate used by the plating apparatus of FIG. 1.

In addition, the shield plate 9 preferably includes shield plate openings 10, as illustrated in FIG. 3. Because the shield plate 9 includes the shield plate openings 10, it is possible to more appropriately control the current distribution. The shape and the external size of the shield plate 9, and the shape, size, number, or the like of the shield plate openings 10, may be selected to become optimum, as appropriate, according to the individuality based on the specific configuration or the like of the plating apparatus 1, the external size of the printed wiring board substrate X, the structure of the exposed seed layer, or the like.

The shield plate openings 10 are preferably formed in an opening region 11 that is a region opposing the printed wiring board substrate X. By providing the plurality of shield plate openings 10 within the region of the shield plate 9 opposing the printed wiring board substrate X, that is, within the region at the part of the shield plate 9 overlapping the printed wiring board substrate X in the front view from the anode 6, it is possible to appropriately control the current distribution. Further, by not providing the openings in the part of the shield plate 9 exceeding the external size of the printed wiring board substrate X, that is, in the region at the part of the shield plate 9 exceeding the external size of the printed wiring board substrate X (the region of the shield plate 9 not opposing the printed wiring board substrate X) in the front view from the anode 6, it is possible to effectively reduce the concentration of the current distribution near the outer peripheral end part of the printed wiring board substrate X.

The opening ratio of the shield plate openings 10 in the opening region 11 is preferably varied between a central opening region 12 that is a region at an approximate center of the opening region 11, and an end opening region 13 that is a region other than the central opening region 12. More particularly, a lower limit value of the opening ratio of the central opening region 12 may be 10%, preferably 15%, and more preferably 20%. An upper limit value of the opening ratio of the central opening region 12 may be 50%, preferably 45%, and more preferably 40%. When the opening ratio of the central opening region 12 does not reach the above lower limit, it may not be possible to deposit the plated layer to a desired thickness. When the opening ratio of the central opening region 12 exceeds the above upper limit, the plated layer may thicken and make contact with an adjacent plated layer.

In addition, as illustrated in FIG. 3, the opening ratio of the end opening region 13 is preferably higher than the opening ratio of the central opening region 12. By making the opening ratio of the end opening region 13 higher than the opening ratio of the central opening region 12, the current distribution with respect to the entire surface of the printed wiring board substrate X can be controlled more precisely, to make the plated layer thickness uniform. More particularly, the opening ratio of the end opening region 13 may be higher than the opening ratio of the central opening 12 by 1%, preferably 2%, and more preferably 3%. In other words, a lower limit value of (opening ratio of end opening region 13/opening ratio of central opening region 12)×100 (%) may be 101%, preferably 102%, and more preferably 103%. An upper limit value of (opening ratio of end opening region 13/opening ratio of central opening region 12)×100 (%) may be 110%, preferably 109%, and more preferably 108%. Because the shield plate openings 10 are not provided at the part on the outer side of the end opening region 13, that is, at the part of the shield plate 9 exceeding the external size of the printed wiring board substrate X, it is possible to reduce the concentration of the current distribution at the outer peripheral end of the printed wiring board substrate X. However, when the opening ratio of the opening region 11 is constant, or does not reach the above lower limit, the formation of the plated layer is promoted at a central part of the printed wiring board substrate X, while the formation of the plated layer is reduced at the peripheral part other than the central part of the printed wiring board substrate X, due to the above-mentioned reducing effect, and it may become difficult to make the plated layer thickness uniform. When the above upper limit is exceeded, the above-mentioned reducing effect deteriorates, and the formation of the plated layer is promoted at the outer peripheral end part of the printed wiring board substrate X, while the formation of the plated layer is reduced at the central part of the printed wiring board substrate X, and it may become difficult to make the plated layer thickness uniform. The opening ratio of the central opening region or the end opening region of the shield plate refers to a ratio of the area of the central opening region or the end opening region (each including the shield plate openings) with respect to the area of the shield plate openings.

The size or the like of the central opening region 12 within the opening region 11 may be adjusted, as appropriate, according to the structure of the exposed seed layer of the printed wiring board substrate X, the area ratio of the printed wiring board substrate X and the shield plate 9 in the plan view, or the like, and is not particularly limited. When providing the end opening region 13 at upper and lower ends of the opening region 11, the central opening region 12 may be a region that is 10% or more and 90% or less, preferably 15% or more and 85% or less, and more preferably 20% or more and 80% or less from the upper end of the opening region 11 in FIG. 3, for example. When the region that is 10% or more and 90% or less from the upper end of the opening region 11 is the central opening region 12, the end opening region 13 may be a region located less than 10% from the upper end of the opening region 11, and a region located more than 90% from the upper end and reaching the lower end of the opening region 11.

In addition, the end opening region 13 may be provided at left and right ends, or at the upper and lower ends and the left and right ends of the opening region 11, according to the configuration, shape, or the like of the frame 4 that holds the printed wiring board substrate X, or the jig.

When providing the end opening region 13 at the left and right ends of the opening region 11, the central opening region 13 may be a region that is 10% or more and 90% or less, preferably 15% or more and 85% or less, and more preferably 20% or more and 80% or less from the left end of the opening region 11 in FIG. 3, for example. When the region that is 10% or more and 90% or less from the left end of the opening region 11 is the central opening region 12, the end opening region 13 may be a region located less than 10% from the left end of the opening region 11, and a region located more than 90% from the left end and reaching the right end of the opening region 11.

When providing the end opening region 13 at the upper and lower ends and the left and right ends of the opening region 11, the central opening region 13 may be a region that is 10% or more and 90% or less from the upper end of the opening region 11, and is 10% or more and 90% or less from the left end of the opening region 11 in FIG. 3, for example. In this case, a region located less than 10% from the upper end of the opening region 11 and a region located more than 90% from the upper end and reaching the lower end of the opening region 11, and a region located less than 10% from the left end of the opening region 11 and a region located more than 90% from the left and reaching the right end of the opening region 11, may become the end opening region 13. The central opening region 13 is preferably a region that is 15% or more and 85% or less from the upper end of the opening region 11, and 15% or more and 85% or less from the left end of the opening region 11, and more preferably a region that is 20% or more and 80% or less from the upper end of the opening region 11, and 20% or more and 80% or less from the left end of the opening region 11.

The shield plate openings 10 are not limited to a particular shape, and a circular hole, a rectangular hole, a diamond-shaped hole, or the like may be used therefor. In addition, the variation in the opening ratio of the end opening region 13 with respect to the central opening region 12 is not particularly limited, and may be a variation due to different opening areas with the same opening shape, a variation due to different opening shapes, a variation due to the number per unit area with the same opening shape and the shape opening area, or the like.

The plating solution storage tank 2 preferably includes a shield plate fixing mechanism that fixes the shield plate 9. By providing the shield plate fixing mechanism, it becomes possible to easily arrange and fix the shield plate 9. In addition, even when a modification is made to the shape, the external size, the structure of the exposed seed layer, or the like of the printed wiring board substrate X, it is possible to easily cope with the modified printed wiring board substrate, by selecting the shield plate having the optimum shape, external size, and shield plate openings for the modified printed wiring board substrate, and fixing the selected shield plate to the shield plate fixing mechanism.

Figure 4:
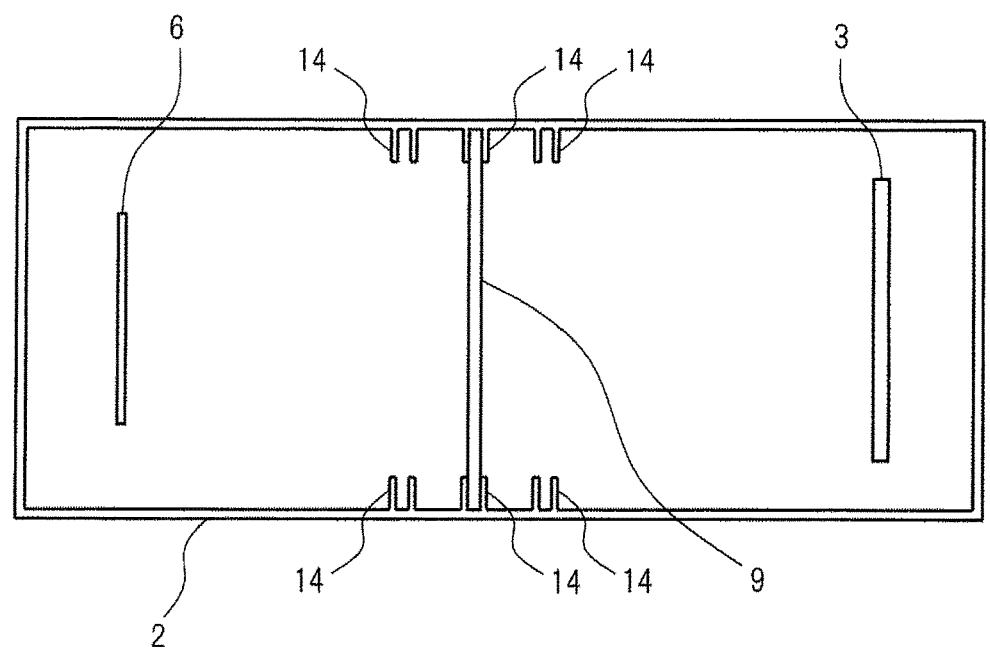
FIG. 4 is a schematic top view illustrating a plating apparatus, different from that of FIG. 1, and is used in the plating process of the printed wiring board production method.

The means for fixing the shield plate 9 is not particularly limited, and as illustrated in FIG. 4, for example, fixing slits 14 that hold the shield plate 9 may be provided on an inner side of left and right (upper and lower in FIG. 4) sidewalls of the plating solution storage tank 2, to extend from an upper surface toward a bottom wall of the plating solution storage tank 2. 1 set is formed by the fixing slits 14 that are provided on the inner side of the left and right sidewalls of the plating solution storage tank 2 to oppose each other, and a plurality of sets are preferably provided. By providing the plurality of sets of the fixing slits 14, it becomes possible to easily move the shield plate 9 to a distance where the optimum shielding effect is obtained, when the shape or the like of the printed wiring board substrate X is modified. The fixing slits 14 may be integrally formed on the plating solution storage tank 2, or may be formed separately and attached to the plating solution storage tank 2. In the case of the separately formed fixing slits, one set of fixing slits may include a mechanism or the like that enables the fixing slits and the shield plate 9 held by the fixing slits to slide toward the front and rear (left and right in FIG. 4) and be fixed at a predetermined position within the plating solution storage tank 2.

(Plating Process)

Next, a state where the plated layer is deposited on the outer surface of the exposed seed layer of the printed wiring board substrate, and the conductive pattern is formed, in the plating process of the printed wiring board production method, will be described. The printed wiring board production method may employ either the additive method or the subtractive method. The additive method includes a full additive method and a semi-additive method. As an example, the plating process using the semi-additive method will be described, by referring to FIG. 5A through FIG. 5D.

(Method Using Semi-Additive Method)

The plating process of this printed wiring board production method includes a seed layer depositing process, a resist pattern forming process, an energizing process, and a conductive pattern forming method.

(Seed Layer Depositing Process)

Figure 5A:
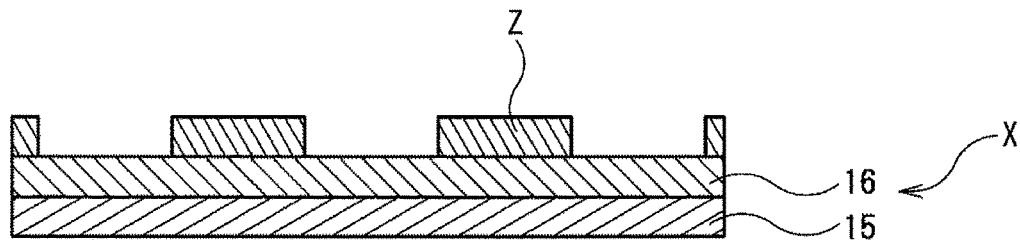
FIG. 5A is a schematic cross sectional view illustrating a printed wiring board substrate after a seed layer depositing process of the printed wiring board production method using a semi-additive method according to one embodiment of the present invention, and formation of a resist pattern.

In the seed layer depositing process, a conductive seed layer 16 is deposited on one surface of an insulating base film 15, as illustrated in FIG. 5A. The main component of the base film 15 includes a synthetic resin such as polyimide, polyethylene terephthalate, or the like, for example. The method of depositing the seed layer 16 is not particularly limited, and known methods including electroless plating, vapor deposition, sputtering, or the like, for example, may be employed. In addition, the main component of the seed layer 16 includes nickel, gold, silver, tungsten, molybdenum, copper, cobalt, chromium, iron, zinc, or the like, and among these elements, copper is preferable from a viewpoint of providing strong adhesion to the base film 15 and a suitable surface for starting the plating. The "main component" refers to a component having a largest content, and includes a component having a content that is 50 mass % or greater, for example.

A lower limit of an average thickness of the seed layer 16 may be 10 nm, preferably 50 nm, and more preferably 100 nm. An upper limit of the average thickness of the seed layer 16 may be 1 μm preferably 700 nm, and more preferably 500 nm. When the average thickness of the seed layer 16 does not reach the above-mentioned lower limit, a discontinuity may be generated in the seed layer 16 in the plan view, to make it difficult to deposit the plated layer to a uniform thickness on an outer surface of the seed layer 16. When the average thickness of the seed layer exceeds the above-mentioned upper limit, the production efficiency may deteriorate.

(Resist Pattern Forming Process)

In the resist pattern forming process, a resist pattern Z is formed on the outer surface of the seed layer 16 that is deposited by the seed layer depositing process, as illustrated in FIG. 5A. More particularly, in the resist pattern forming process, a photosensitive resist is first deposited on the outer surface of the seed layer 16. Next, a patterning corresponding to the conductive pattern is performed with respect to the resist, by exposing, developing, or the like, to form the resist pattern Z.

(Energizing Process)

Figure 5B:
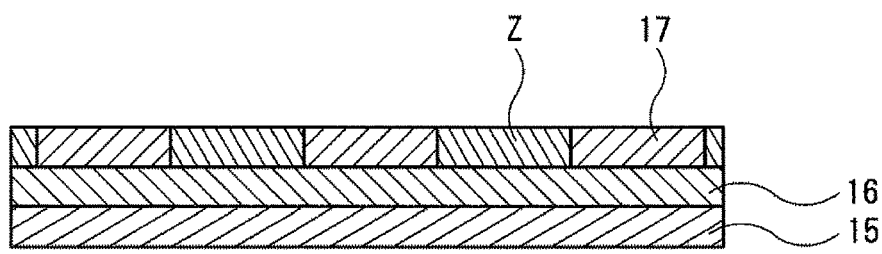
FIG. 5B is a schematic cross sectional view illustrating the printed wiring board substrate in a state where a plated layer is deposited after an energizing process of the printed wiring board production method using the semi-additive method according to one embodiment of the present invention, and formation of a resist pattern.

In the energizing process, the voltage applying mechanism 7 supplies a current to the anode 6 and the printed wiring board substrate X. By this energizing process, a plated layer 17 is deposited on the seed layer 16 having no resist pattern Z deposited thereon, that is, on the outer surface of the exposed seed layer, as illustrated in FIG. 5B.

The main component of the plated layer 17 that is deposited in the energizing process includes copper, nickel, silver, or the like. Among these elements, copper is preferable because of the good conductivity and the ease with which the plated layer 17 having a uniform thickness can be formed at a relatively low cost.

An average thickness of the plated layer 17 that is deposited in the energizing process is preferably 30 μm or greater. In addition, thickness inconsistencies of the plated layer 17, that is, a difference between the average thickness and a maximum thickness, and a difference between the average thickness and a minimum thickness, are preferably 15% or less, respectively. When the plated layer thickness of the conductive pattern of the printed wiring board is 30 μm or greater, and the inconsistency of the thickness is within 15% of the average thickness of the plated layer, it is possible to stabilize the performance of the product device using the printed wiring board with such plated layer thickness. The difference between the average thickness and each of the maximum thickness and the minimum thickness of the plated layer 17 is preferably as small as possible, and a lower limit of this difference may be 0%. The plated layer thickness and the inconsistency thereof do not include the part of the plated layer thickness not forming the product, and need only be managed for the printed wiring board that becomes the product. More particularly, a non-product part including a predetermined range from the outer edge of the printed wiring board substrate X, such as a part where the frame 4 (FIG. 2) holds the printed wiring board substrate X, or the like, is not included the target to be managed of the plated layer thickness.

(Conductive Pattern Forming Process)

Figure 5C:
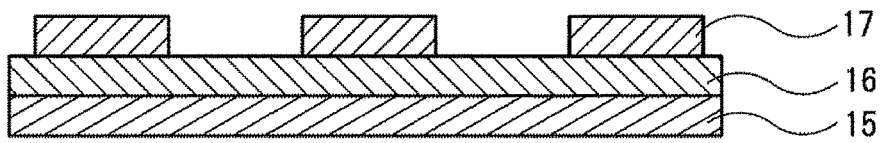
FIG. 5C is a schematic cross sectional view illustrating a state after removal of the resist pattern in a conductive pattern forming process of the printed wiring board production method using the semi-additive method according to one embodiment of the present invention, and formation of a resist pattern.
Figure 5D:
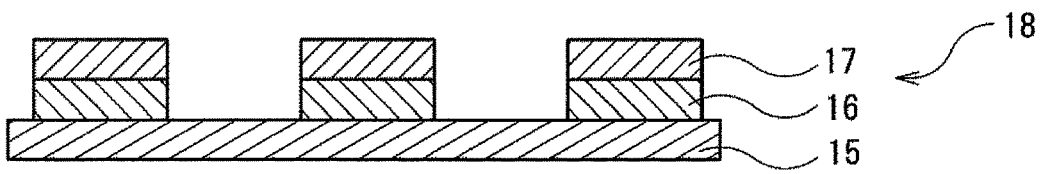
FIG. 5D is a schematic cross sectional view illustrating the printed wiring board after the conductive pattern forming process of the printed wiring board production method using the semi-additive method according to one embodiment of the present invention, and formation of a resist pattern.

In the conductive pattern forming process, a conductive pattern 18 is formed on one surface of the base film 15, as illustrated in FIG. 5D. More particularly, in the conductive pattern forming process, the resist pattern Z is first removed, as illustrated in FIG. 5C, and a region where the resist pattern Z was deposited on the seed layer 16 is next removed by an etching or the like, as illustrated in FIG. 5D.

[Advantages]

By setting the distance between the printed wiring board substrate X and the shield plate 9 to 50 mm or greater and 150 mm or less in the plating process, and optimizing the shape or the like of the shield plate 9, this printed wiring board production method can deposit the plated layer having the thickness that is uniform to the same extent as or more uniform than that obtained by the method that arranges a shield element adjacent to the printed wiring board substrate. In addition, because the printed wiring board substrate X and the shield plate 9 are separated, it is possible to easily and quickly perform operations of arranging and replacing the printed wiring board substrate X and the shield plate 9. Further, in the case of the method that arranges the shield element adjacent to the printed wiring board substrate, rigid fixing of the shield element is required to prevent the precise positioning of the shield element with respect to the printed wiring board substrate, and the positional relationship of the printed wiring board substrate and the shield element, from deviating due to vibration or the like during the plating process. On the other hand, because the shield plate 9 that is separated from the printed wiring board substrate X can appropriately control the current distribution within the plating solution Y in the disclosed printed wiring board production method, it is possible to deposit the plated layer having the uniform thickness, even when a slight error is generated in the positional relationship of the shield plate 9 and the printed wiring board substrate X. Hence, the operations of arranging and replacing the printed wiring board substrate X and the shield plate 9 can be performed in an extremely simple manner. Accordingly, it is possible to improve the production efficiency of the printed wiring board having the conductive pattern that is formed by the plated layer having the uniform thickness.

Second Embodiment

<Printed Wiring Board Production Method>

The printed wiring board production method according to another embodiment of the present invention will be described, by referring to FIG. 6. In this embodiment, constituent parts that are the same as those of the first embodiment will be designated by the same reference numerals, and a description thereof will be omitted.

The plating process of this printed wiring board production method deposits, by the plating apparatus 1, the plated layer on the outer surface of the exposed seed layer of the printed wiring board substrate X forming the cathode. In the plating apparatus 1, the shield plate 9 is arranged 50 mm or greater and 150 mm or less from the printed wiring board substrate X, and an anode shield plate 19 is further arranged, so that a more appropriate current distribution is obtained within the plating solution Y, the metal ions are more uniformly reduced on the outer surface of the seed layer, and the uniformity of the plated layer thickness is further improved. The plating process of this printed wiring board production method differs from the plating process of the above-mentioned first embodiment, in that the anode shield plate 19 is provided, and thus, a description will hereinafter be given mainly on the anode shield plate 19.

(Anode Shield Plate)

The anode shield plate 19 has a constant thickness and a plate shape. The shape of the anode shield plate 19 is not particularly limited, but when the shape of the anode 6 is rectangular in the plan view, the shape of the anode shield plate 19 in the plan view is preferably rectangular.

A material used for the anode shield plate 19 is not particularly limited, as long as the material is an insulator that has plating resistance, similar to the shield plate 9.

The anode shield plate 19 is arranged between the anode 6 and the shield plate 9. More particularly, the anode shield plate 19 is arranged parallel to the anode 6, and overlaps the shield plate 9 in the front view from the printed wiring board substrate X. In the plating solution Y, the distribution of the current flowing from the anode 6 to the exposed seed layer of the printed wiring board substrate X forming the cathode, becomes dense near the outer peripheral end part of the printed wiring board substrate X, and the plating layer becomes thick thereat. In addition, even at parts other than the outer peripheral end part of the printed wiring board substrate X, the current distribution becomes sparse at parts where the exposed seed layer is densely provided, and the current distribution becomes dense at parts where the exposed seed layer is sparsely provided, to thereby generate inconsistencies in the plated layer thickness. Further, depending on individuality based on the specific configuration or the like of the apparatus, it may be difficult to obtain a uniform current distribution. The shield plate 9 and the anode shield plate 19 are arranged to make uniform the current distribution that may become sparse or dense. In other words, it is possible to uniformly deposit the plated layer by arranging the shield plate 9 and the anode shield plate 19. Moreover, "the shield anode plate 19 that overlaps the shield plate 9 in the front view from the printed wiring board substrate X" referred above includes a state where the anode 6 is concealed by the anode shield plate 19 in the front view from the printed wiring board substrate X when the external size of the anode shield plate 19 is larger than the external size of the anode 6, and a state where the anode shield plate 19 falls within a range of the anode 6 in the front view from the printed wiring board substrate X when the external size of the anode shield plate 19 is the same as or smaller than the external size of the anode 6.

The position where the anode shield plate 19 is arranged is not particularly limited, as long as the position is between the shield plate 9 and the anode 6, and the anode shield plate 19 does not make contact with the shield plate 9 and the anode 6. A lower limit value of the distance of the anode shield plate 19 from the printed wiring board substrate X may be 100 mm, and preferably 125 mm. An upper limit value of the distance may be 300 mm, and preferably 250 mm. When the distance does not reach the lower limit, it may become difficult to uniformly deposit the plated layer on the printed wiring board substrate X. When the distance exceeds the upper limit, it may become difficult to control the plated layer thickness deposited on the printed wiring board substrate X. "The distance of the anode shield plate 19 from the printed wiring board substrate X" refers to the distance between the center of the printed wiring board substrate X having the exposed seed layer, and a center of the anode shield plate 19.

Figure 6:
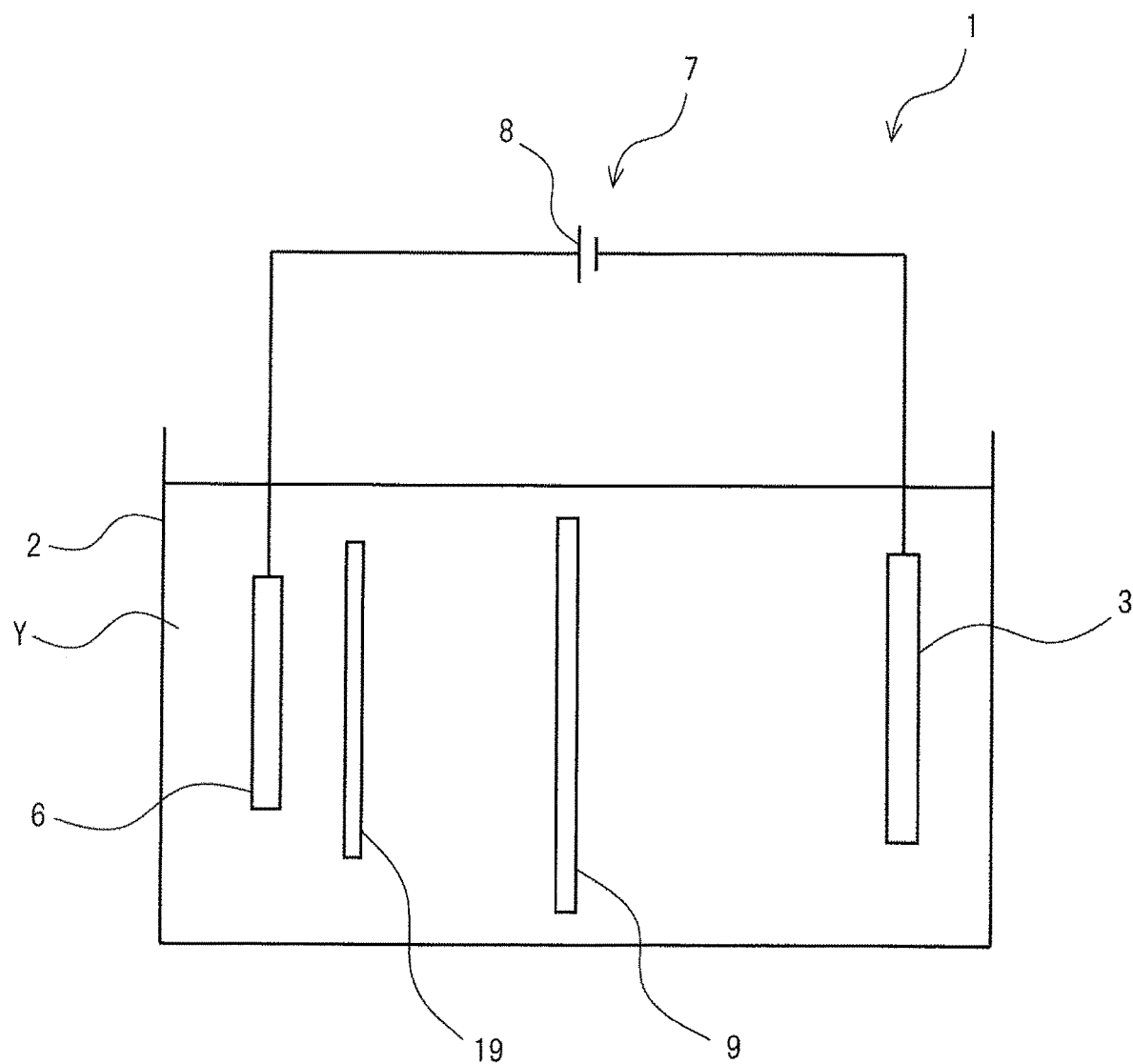
FIG. 6 is a schematic side view illustrating a plating apparatus different from those of FIG. 1 and FIG. 4.

An external size of the anode shield plate 19 that is formed to the rectangular shape as illustrated in FIG. 6 is not particularly limited, but a lower limit value of the length along the up and down direction may be 300 mm, and preferably 550 mm. An upper limit value of the length along the up and down direction may be 1100 mm, and preferably 850 mm. A lower limit value of the length along the horizontal direction may be 400 mm, and preferably 500 mm. An upper limit value of the length along the horizontal direction may be 1100 mm, and preferably 800 mm.

Figure 7:
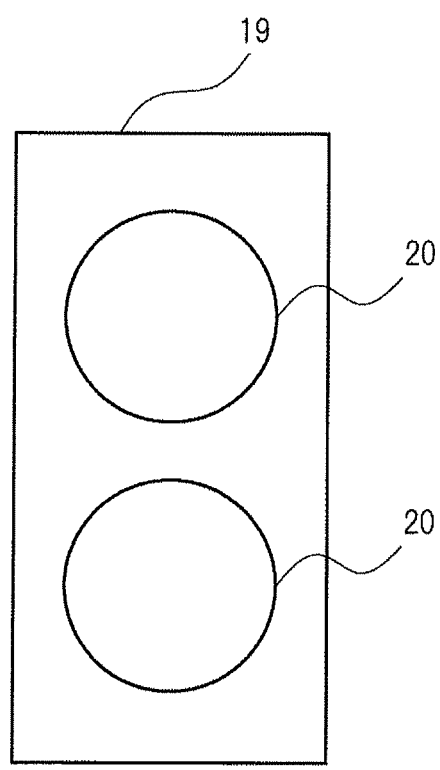
FIG. 7 is a schematic front view illustrating an anode shield plate used by the plating apparatus of FIG. 6.

In addition, the anode shield plate 19 preferably includes anode shield plate openings 20, as illustrated in FIG. 7. Because the anode shield plate 19 includes the anode shield plate openings 20, it is possible to partially validate and invalidate the current generated from the anode 6, and more precisely control the current distribution. In addition, the area of the anode shield plate 19, including the anode shield plate openings 20, is preferably greater than the area of the anode 6 immersed in the plating solution. When the area of the anode shield plate 19, including the anode shield plate openings 20, is greater than the area of the anode 6 immersed in the plating solution, it is possible to easily control the current distribution near the outer peripheral end part of the printed wiring board substrate X. The shape and the external size of the anode shield plate 19, and the shape, size, number, or the like of the anode shield plate openings 20, may be selected to become optimum, as appropriate, according to the individuality based on the specific configuration or the like of the plating apparatus 1, the shape, the external size, and the output of the anode 6, the size of the printed wiring board substrate X, or the like.

[Advantages]

By using the plating apparatus 1 that is provided with the anode shield plate 19 together with the shield plate 9 in the plating process, this printed wiring board production method can more appropriately control the current distribution within the plating solution Y. A good workability can be obtained by setting the distance between the printed wiring board substrate X and the shield plate 9 to 50 mm or greater and 150 mm or less, and the plated layer having a more uniform thickness can be deposited on the exposed seed layer of the printed wiring board substrate X by providing the anode shield plate 19. Accordingly, it is possible to improve the production efficiency of the printed wiring board having the refined conductive pattern that is formed by the plated layer having the more uniform thickness.

Third Embodiment

<Printed Wiring Board Production Method>

Figure 8:
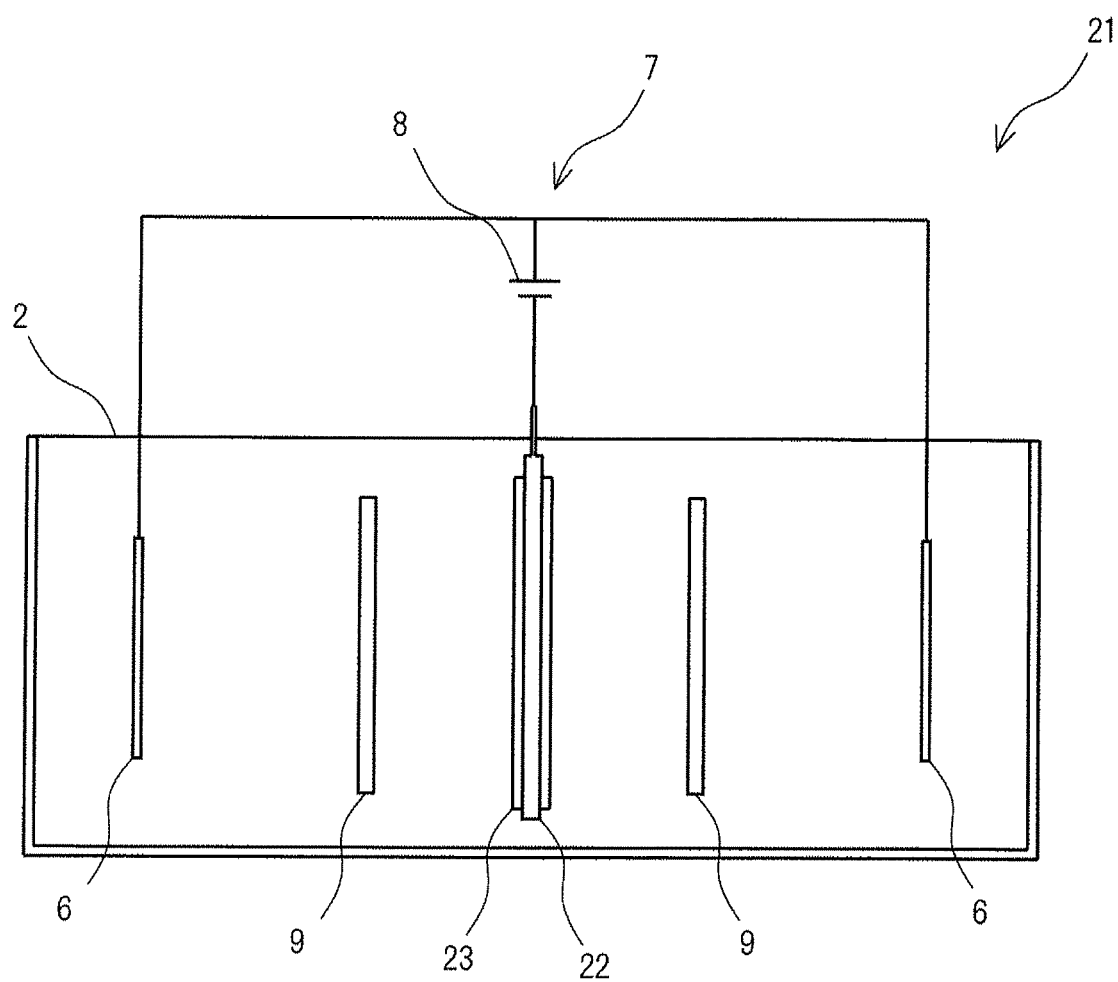
FIG. 8 is a schematic side view illustrating a plating apparatus different from those of FIG. 1, FIG. 4, and FIG. 6.

The printed wiring board production method according to still another embodiment of the present invention will be described, by referring to FIG. 8. In this embodiment, constituent parts that are the same as those of the first embodiment will be designated by the same reference numerals, and a description thereof will be omitted.

The plating process of this printed wiring board production method uses a plating apparatus 21 to deposit the plated layer on the exposed seed layer on both surfaces of the printed wiring board substrate X forming the cathode.

The plating apparatus 21 used by the plating process includes the plating solution Y, the plating solution storage tank 2, and the voltage applying mechanism 7. A pair of anodes 6 is arranged to oppose each other near both sidewalls within the plating solution storage tank 2, and a cathode bus bar 22 is provided at an approximate center between the anodes 6. The cathode bus bar 22 holds a substrate fixing jig 23 that fixes the printed wiring board substrate X, and the exposed seed layer of the printed wiring board substrate X forms the cathode. The shield plate 9 is provided between the cathode bus bar 22 and each of the pair of anodes 6. The 2 shield plates 9 are respectively arranged at a distance of 50 mm or greater and 150 mm or less from the front surface and the rear surface of the printed wiring board substrate X. The pair of anodes 6, the shielding plates 9, and the printed wiring board substrate X are arranged in parallel to overlap each other in a front view from one of the anodes 6.

When the current from the voltage applying mechanism 7 flows to the printed wiring board substrate X forming the cathode, via the pair of anodes 6 and the cathode bus bar 22, the plated layer is deposited on the exposed seed layer on both surfaces of the printed wiring board substrate X.

[Advantages]

Because the 2 shield plates 9 are respectively arranged at the distance of 50 mm or greater and 150 mm or less from the front surface and the rear surface of the printed wiring board substrate X, this printed wiring board production method can deposit the plated layer having a uniform thickness on both surfaces of the printed wiring board substrate X. In addition, in the case of the printed wiring board production method that arranges the shield object adjacent to the printed wiring board substrate, a spacing between the 2 shield objects inevitably becomes narrow, and may cause a collision between the substrate fixing jig and the shield object when arranging and replacing the printed wiring board substrate, in which case the operations of arranging and replacing the printed wiring board substrate may need to be performed delicately and carefully. Moreover, in order to avoid collision with the shield object during the operations of arranging and replacing the printed wiring board substrate, the plating apparatus may need to be modified to enable simple attachment and detachment of the cathode bus bar. On the other hand, in the printed wiring board production method according to this embodiment, the spacing between the 2 shield plates 9 is large, and the operations of arranging and replacing the printed wiring board substrate X can be performed with extreme ease. Hence, a good workability can be achieved, and a modification or the like of the plating apparatus 21 becomes unnecessary. Accordingly, it is possible to improve the production efficiency of the printed wiring board having the conductive pattern that is formed by the plated layer having the uniform thickness on both the front surface and the rear surface of the substrate.

Fourth Embodiment

<Printed Wiring Board Production Method>

Figure 9:
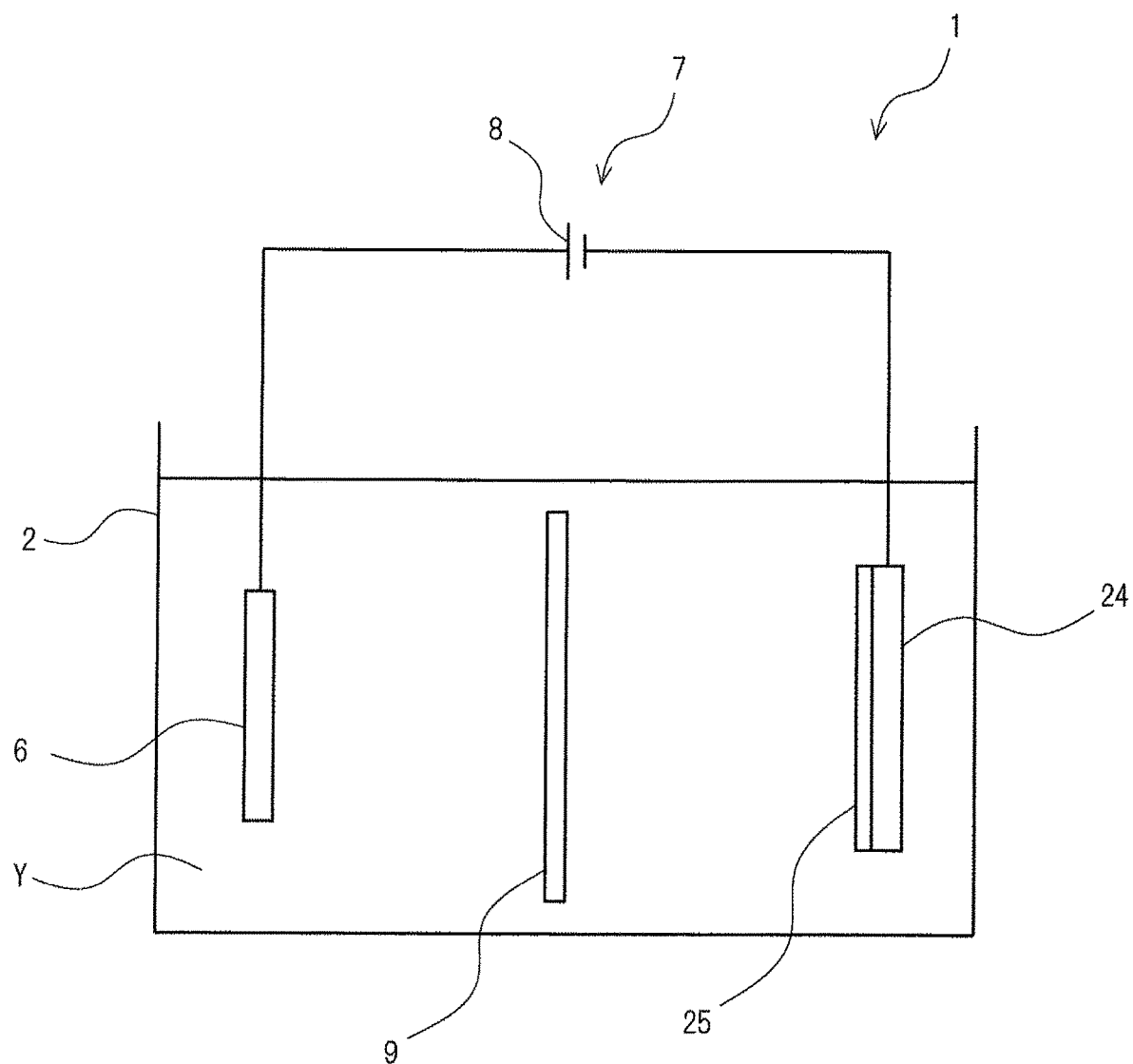
FIG. 9 is a schematic side view illustrating a plating apparatus different from those of FIG. 1, FIG. 4, FIG. 6, and FIG. 8.

The printed wiring board production method according to a further embodiment of the present invention will be described, by referring to FIG. 9. In this embodiment, constituent parts that are the same as those of the first embodiment will be designated by the same reference numerals, and a description thereof will be omitted.

A plating apparatus used by this printed wiring board production method includes the plating solution storage tank 2 that stores the plating solution Y, a fixing jig 24 that fixes the printed wiring board substrate X forming the cathode and immersed in the plating solution Y, the anode 6 arranged to oppose the printed wiring board substrate X and immersed in the plating solution Y, and the voltage applying mechanism 7.

The plating process of this printed wiring board production method uses the plating apparatus 1 to deposit the plated layer on the outer surface of the exposed seed layer of the printed wiring board substrate X forming the cathode. Because the fixing jig 24 includes a shield member 26, in addition to the shield plate 9, this printed wiring board production method can more appropriately control the current distribution within the plating solution Y, uniformly reduce the metal ions on the outer surface of the seed layer, further improve the uniformity of the plated layer thickness. The plating process of this printed wiring board production method differs from the plating process of the above-mentioned first embodiment, in that the shield member 26 is provided, and thus, a description will hereinafter be given mainly on the shield member 26.

(Fixing Jig)

Figure 10:
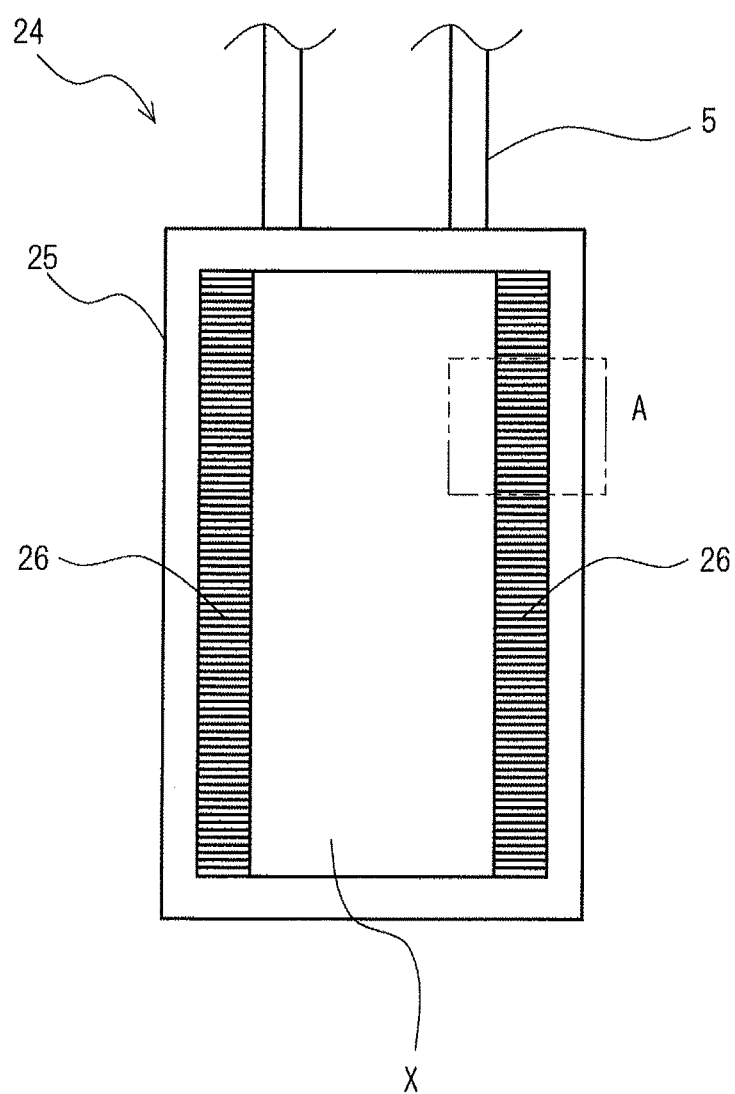
FIG. 10 is a schematic front view illustrating a fixing jig different from that of FIG. 2.

The fixing jig 24 includes a frame 25, and a pair of arms 5 extending upward from the frame 25, as illustrated in FIG. 10, and the frame 25 includes an opening for accommodating the printed wiring board substrate X, and holds the outer edge of the printed wiring board substrate X.

The frame 25 includes an inner edge and an outer edge forming a rectangular frame body, and holds the printed wiring board substrate X therein. In other words, the frame 25 holds the printed wiring board substrate X so as to cover the outer periphery of the printed wiring board substrate X. In addition, the frame 25 includes shield members 26 at parts that hold sides of the printed wiring board substrate X. As an example, the frame 25 that holds the entire outer periphery of the printed wiring board substrate X will be described, however, the frame 25 is not limited to such, and may include a frame that holds two sides of the printed wiring board substrate X, such as the left and right sides in FIG. 10, for example.

[Shield Member]

The shield members 26 are provided at the parts of the frame 25 that hold the sides of the printed wiring board substrate X. The shield members 26 are arranged parallel to the surface of the printed wiring board substrate X, and overlap predetermined regions at the end parts along a width direction (horizontal direction in FIG. 10) of the printed wiring board substrate X in a front view from the anode 6 or the shield plate 9. The shield members 26 are provided from one end part to the other end part along a height direction (vertical direction in FIG. 10) of the printed wiring board substrate X in the front view from the anode 6 or the shield plate 9. In the plating solution Y, a distribution of the current flowing from the anode 6 to the exposed seed layer of the printed wiring board substrate X foisting the cathode, becomes dense near the outer peripheral end part of the printed wiring board substrate X, and the plating layer may become thick thereat. In addition, depending on individuality based on the specific configuration or the like of the apparatus, it may be difficult to obtain a uniform current distribution. In this printed wiring board production method, the shield plate 9 is arranged and the shield members 26 are provided, to make uniform the current distribution that may become sparse or dense.

In the front view from the anode 6 or the shield plate 9, an area of regions where the shield member 26 overlaps an end part (first end part) on a first side and an end part (second end part) on a second side of the printed wiring board substrate X along the width direction, is preferably 2% or higher and 30% or lower than the area of the printed wiring board substrate X. In addition, a lower limit value of a ratio of the area of the regions where the shield member 26 overlaps the first end part or the second end part of the printed wiring board substrate X, with respect to the area of the printed wiring board substrate X, is preferably 1%, more preferably 2.4%, and even more preferably 4.8%. An upper limit value of the above-mentioned ratio is preferably 15%, more preferably 11.9%, and even more preferably 8.8%.

When the ratio does not reach the lower limit value, the shielding effect may not be exhibited, and it may not be possible to make the plated layer thickness uniform at the ends along the width direction of the printed wiring board substrate X. When the above-mentioned ratio exceeds the upper limit value, the shielding effect may become excessive, and it may not be possible to make the plated layer thickness uniform at the end parts along the width direction of the printed wiring board substrate X. Further, the area of the region where the shield member 26 overlaps the first end part of the printed wiring board substrate X, and the area of the region where the shield member 26 overlaps the second end part of the printed wiring board substrate X, are preferably the same.

A distance between the surface of the printed wiring board substrate X on the side provided with the shield member 26, and a surface of the shield member 26 opposing the surface of the printed wiring board substrate X, is not particularly limited, as long as the shield member 26 does not make contact with the shield plate 9 and the surface of the printed wiring board substrate X, between the shield plate 9 and the printed wiring board substrate X, but the shield member 26 is preferably arranged at a distance of 1 mm or greater and 50 mm or less from the surface of the printed wiring board substrate X. A lower limit value of the above-mentioned distance is preferably 2.5 mm, and more preferably 5 mm. An upper limit value of the above-mentioned distance is preferably 30 mm, and more preferably 15 mm. When the distance does not reach the lower limit value, the shielding effect may become excessive, and it may not be possible to make the plated layer thickness uniform at the end parts along the width direction of the printed wiring board substrate X. When the distance exceeds the upper limit value, the shielding effect may not be exhibited, and it may not be possible to make the plated layer thickness uniform at the end parts along the width direction of the printed wiring board substrate X.

The shape of the shield member 26 is not particularly limited, as long as the end regions along the width direction of the printed wiring board substrate X can be covered, and may be a plate shape, for example.

Figure 11:
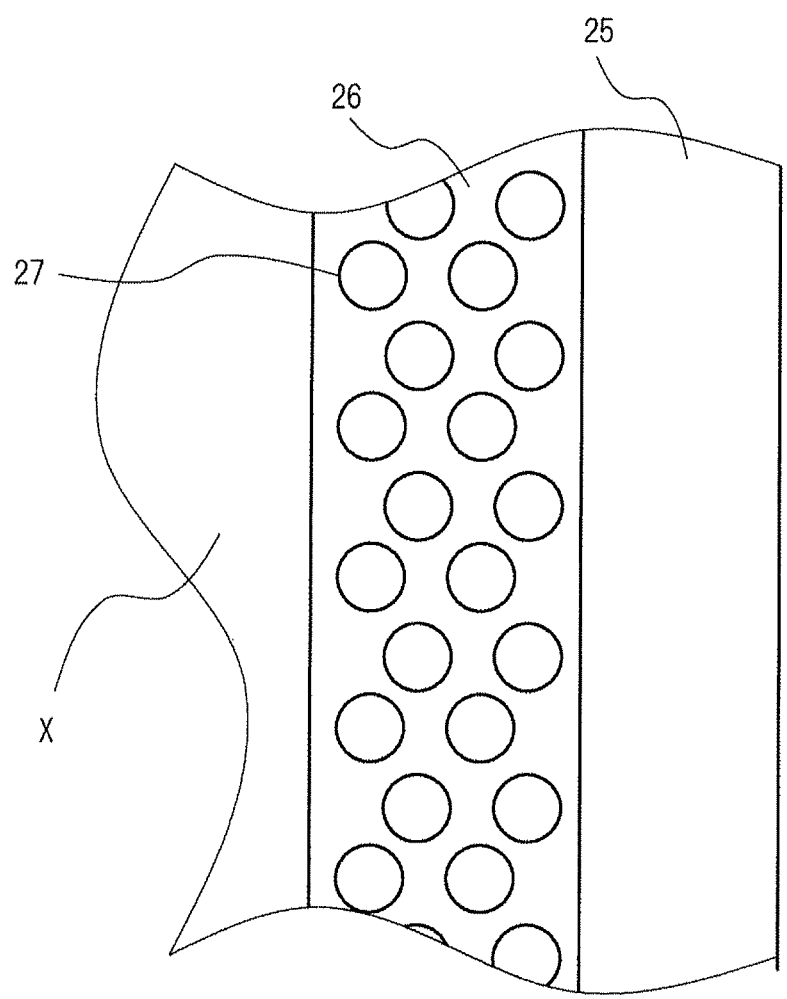
FIG. 11 is a schematic enlarged front view of a part of a shield member, enlarged within a frame A of FIG. 10.

The shield member 26 preferably includes shield member openings 27, as illustrated in FIG. 11. When the shield member 26 covers the end regions along the width direction of the printed wiring board substrate X, it is possible to reduce the ease with which the current density at the end parts along the width direction of the printed wiring board substrate X becomes dense, and by including the shield member openings 27 in the shield member 26, it becomes possible to precisely control the current distribution, and deposit the plated layer having the uniform thickness on the printed wiring board substrate X.

An opening ratio of the shield member 26 is preferably 20% or higher and 80% or lower. By setting the above-mentioned opening ratio in this range, it becomes possible to easily and precisely control the current distribution. A lower limit value of the opening ratio is preferably 30%, and more preferably 40%. An upper limit value of the opening ratio is preferably 70%, and more preferably 60%. When the opening ratio does not reach the lower limit value, the effect of controlling the current distribution may not be sufficiently exhibited, and it may be difficult to make the plated layer thickness uniform. When the opening ratio exceeds the upper limit value, the shielding effect may deteriorate, and it may not be possible to make the plated layer thickness uniform. The opening ratio of the shield member refers to a ratio of the area of the shield member openings with respect to the area of the shield member (including the shield member openings).

The shield member openings 27 are not limited to a particular shape, and a circular hole, a rectangular hole, a diamond-shaped hole, or the like may be used therefor. In addition, the shield member openings 27 having the same shape may be arranged at the same spacing, or alternatively, the shield member openings 27 having different shapes may be arranged at arbitrary spacings.

Figure 12:
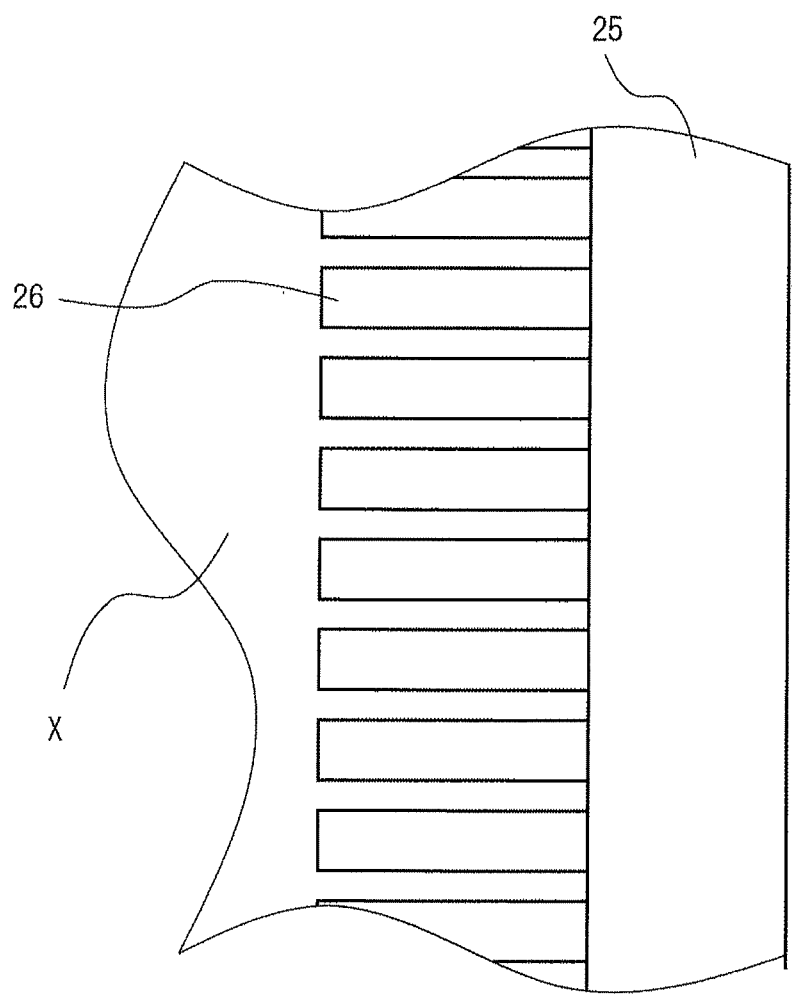
FIG. 12 is a schematic enlarged front view illustrating a shield member different from that of FIG. 11.

As illustrated in FIG. 12, a plurality of plate-shaped or boss-shaped (pillar-shaped) shield members 26 may be provided at a constant spacing. In other words, instead of providing the shield member openings 27 in the shield member 26, the shield members 26 having a predetermined shape may be provided at the constant spacing, to enable control of the current distribution at the end parts along the width direction of the printed wiring board substrate X. In this case, the plurality of shield members 26 may have different shapes, instead of having the same shape. In addition, the spacing with which the plurality of shield members 26 are provided may be arbitrary, instead of being set constant.

A material used for the shield members 26 is not particularly limited, as long as the material is an insulator that has plating resistance, similar to the shield plate 9, and known materials may be used therefor.

[Advantages]

The plating process of this printed wiring board production method uses the fixing jig 24 having the shield members 26, in the plating apparatus 1 provided with the shield plate 9, and thus, it is possible to more appropriately control the current distribution within the plating solution Y. Generally, when a positional error is generated along the width direction of the printed wiring board substrate X, that is, when the plating process is performed in a state where one side of the printed wiring board substrate X is arranged close to one sidewall of the plating solution storage tank 2, and the other side of the printed wiring board substrate X is arranged distant from the other sidewall of the plating solution storage tank 2, the current distribution becomes distorted near the end parts along the width direction of the printed wiring board substrate X, and the plated layer thickness easily becomes inconsistent. But because the shield members 26 are provided in predetermined regions at the end parts along the width direction of the printed wiring board substrate X, this printed wiring board production method can reduce the distortion of the current distribution near the end parts along the width direction of the printed wiring board substrate X, even when the positional error is generated along the width direction of the printed wiring board substrate X, and it is thus possible to deposit the plated layer having a more uniform thickness on the exposed seed layer of the printed wiring board substrate X. Accordingly, it is possible to improve the production efficiency of the printed wiring board having the refined conductive pattern that is formed by the plated layer having the more uniform thickness.

Other Embodiments

The present invention is not limited to the examples of embodiments disclosed above. The scope of the present invention is not limited the structure of the above-mentioned embodiments, and is intended to include all modifications within the meaning and scope of the claims presented and equivalents thereof.

The plating process of the printed wiring board production method according to the third embodiment described above arranges the printed wiring board substrate at the approximate center of the plating solution storage tank, and the arranges the pair of anodes so that the printed wiring board substrate is sandwiched between the pair of anodes. However, a different plating process of the printed wiring board production method, that arranges the anode at the approximate center of the plating solution storage tank, arranges a pair of printed wiring board substrates so that the anode is sandwiched between the pair of printed wiring board substrates, and simultaneously deposits the plated layer on one surface of each of the printed wiring board substrates, also falls within the scope of the present invention.

In addition, although the plating process of the printed wiring board production method described above uses the shield plate and the anode shield plate, it is also within the scope of the present invention to further use one or two or more shield plates. For example, the shield plate may be divided into a plurality of plates, and these plates may be arranged in parallel between the anode and the printed wiring board substrate, or the like.

Further, in the described printed wiring board production method, the example of the fixing jig includes the shield members extending from the upper end to the lower end of the printed wiring board substrate at the end regions along the width direction of the printed wiring board substrate, however, the present invention is not limited to this example. It is within the scope of the present invention to provide the shield member at a part of the end region along the width direction of the printed wiring board substrate, and to provide the shield member of the fixing jig at a part or an entirety of the end region along a vertical (perpendicular) direction of the printed wiring board substrate.

The printed wiring board substrate used in the plating process of the printed wiring board production method is not limited to a printed wiring board substrate from which 1 printed wiring board is obtained, but may be a printed wiring board substrate from which 2 or more printed wiring boards are obtained.

In a case where the plated solution storage tank accommodates a plurality of printed wiring board substrates, or is provided with a plurality of anodes, the voltage applying mechanism may be configured as a voltage applying mechanism that includes a plurality of power supplies.

DESCRIPTION OF THE REFERENCE NUMERALS 1, 21 Plating Apparatus
2 Plating Solution Storage Tank
3, 24 Fixing Jig
4, 25 Frame
5 Arm
6 Anode
7 Voltage Applying Mechanism
8 Power Supply
9 Shield Plate
10 Shield Plate Opening
11 Opening Region
12 Central Opening Region
13 End Opening Region
14 Fixing Slit
15 Base film
16 Seed Layer
17 Plated Layer 18 Conductive Pattern
19 Anode Shield Plate
20 Anode Shield Plate Opening
22 Cathode Bus Bar
23 Substrate Fixing Jig
26 Shield Member
27 Shield Member Opening
X Printed Wiring Board Substrate
Y Plating Solution
Z Resist Pattern

The invention claimed is:

1. A printed wiring board production apparatus that forms a conductive pattern on a base film by an additive method or a subtractive method, comprising:
   a plating solution storage tank;
   a substrate fixing mechanism configured to fix a printed wiring board substrate that is a target to be plated;
   an anode arranged to oppose the printed wiring board substrate;
   a shield plate arranged between the printed wiring board substrate and the anode;
   an anode shield plate arranged between the shield plate and the anode, so as not to make contact with the shield plate nor the anode, and
   a voltage applying mechanism configured to apply a voltage to the anode and the printed wiring board substrate that forms a cathode,
   wherein a distance between the shield plate and the printed wiring board substrate is 50 mm or greater but 150 mm or less,
   wherein a distance between the anode shield plate and the printed wiring board substrate is 100 mm or greater but 300 mm or less,
   wherein the shield plate includes an opening region opposing the printed wiring board substrate in a plan view, and shield plate openings formed in an array within the opening region,
   wherein the opening region includes a central opening region at a center portion of the opening region, and a pair of end opening regions at end portions on opposite ends of the central opening region, and
   wherein an opening ratio of each of the pair of end opening regions is higher than the opening ratio of the central opening region.

2. The printed wiring board production apparatus as claimed in claim 1, wherein the plating solution storage tank includes a shield plate fixing mechanism configured to fix the shield plate.

3. The printed wiring board production apparatus as claimed in claim 1, wherein
   an opening ratio of the central opening region of the opening region is 10% or higher but 50% or lower.

4. The printed wiring board production apparatus as claimed in claim 1, wherein an external size of the shield plate is larger than an external size of the printed wiring board substrate in a plan view.

5. The printed wiring board production apparatus as claimed in claim 1, wherein
   the anode shield plate includes a plurality of anode shield plate openings, and
   an area of the anode shield plate, including the plurality of anode shield plate openings, is larger than an immersion area of the anode into a plating solution stored in the plating solution storage tank during the plating process.

6. The printed wiring board production apparatus as claimed in claim 1, wherein the shield plate, in a front view of the anode, includes
   a frame shaped region having an external size exceeding an external size of the printed circuit board substrate,
   the central opening region, located at a center on an inner side of the frame shaped region, and
   the pair of end opening regions located at an upper end and a lower end of the central opening region, respectively, on the inner side of the frame shaped region,
   wherein the frame shaped region completely surrounds the central opening region and the pair of end opening regions.

7. The printed wiring board production apparatus as claimed in claim 1, wherein the anode shield plate includes a plurality of anode shield plate openings.

8. The printed wiring board production apparatus as claimed in claim 1, wherein
   an opening ratio of the central opening region of the opening region is 10% or higher but 50% or lower, and
   an opening ratio of each of the pair of end opening regions of the opening region is 101% or higher but 110% or lower.

* * * * *